(12) United States Patent
Cogan et al.

(10) Patent No.: US 7,932,133 B2
(45) Date of Patent: Apr. 26, 2011

(54) CIRCUIT PROTECTION METHOD USING DIODE WITH IMPROVED ENERGY IMPULSE RATING

(75) Inventors: Adrian I. Cogan, Redwood City, CA (US); Jiyuan Luan, Fremont, CA (US); Adrian Mikolajczak, Los Altos, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 566 days.

(21) Appl. No.: 11/724,907

(22) Filed: Mar. 15, 2007

(65) Prior Publication Data

US 2007/0166942 A1      Jul. 19, 2007

Related U.S. Application Data

(63) Continuation of application No. 10/868,583, filed on Jun. 14, 2004, now abandoned.

(51) Int. Cl.
    *H01L 21/332* (2006.01)
(52) U.S. Cl. .................... 438/140; 257/E21.35
(58) Field of Classification Search ............... 438/140; 257/E21.35
    See application file for complete search history.

(56) References Cited

U.S. PATENT DOCUMENTS

| | | |
|---|---|---|
| 3,391,287 A | 7/1968 | Kao et al. |
| 3,677,838 A | 7/1972 | DeBrebisson |
| 4,030,117 A | 6/1977 | Kling |
| 4,099,998 A | 7/1978 | Ferro et al. |
| 4,323,909 A | 4/1982 | Valdmann |
| 4,587,547 A | 5/1986 | Amemiya et al. |
| 4,901,183 A | 2/1990 | Lee |
| 5,001,537 A | 3/1991 | Colman et al. |

(Continued)

FOREIGN PATENT DOCUMENTS

DE       3621200 A1     1/1988

(Continued)

OTHER PUBLICATIONS

RCA, "High Frequency Power Transistors", Solid-State Devices Manual, p. 119-120, 1975.

(Continued)

*Primary Examiner* — W. David Coleman

(57) ABSTRACT

A method for protecting a circuit from a high energy pulse includes placing a PPTC resistive element in series with the circuit and placing an energy pulse clamping semiconductor diode in shunt across the circuit and further includes forming the diode to have: a substrate with carriers of a first type of conductivity in a first, high concentration level (e.g. n++), a first major face and a second major face opposite to the first major face; a layer of semiconductor material having carriers of the first type of conductivity in a second concentration level lower than the first level (e.g. n+), and an outer surface; a region formed at an outer surface having carriers of a second type of conductivity in a third concentration level (e.g. p+); at least one cell having carriers of the second type of conductivity in a fourth concentration level greater than the third concentration level (e.g. p++); and, a cathode electrode and an anode electrode. In the method, the diode region becomes a second-level bi-directional intrinsic conduction region as an intrinsic temperature of the region is approached in response to thermal energy initially generated at the diode cell in response to the high energy electrical pulse. The method includes thermally coupling the diode to the PPTC resistive element to accelerate trip thereof in response to the high energy electrical pulse.

8 Claims, 5 Drawing Sheets

U.S. PATENT DOCUMENTS

| | | | |
|---|---|---|---|
| 5,430,311 | A | 7/1995 | Murakami et al. |
| 5,432,360 | A | 7/1995 | Kim et al. |
| 5,612,568 | A * | 3/1997 | Arai .............................. 257/481 |
| 5,851,882 | A | 12/1998 | Harshfield |
| 5,973,359 | A | 10/1999 | Kobayashi et al. |
| 6,215,633 | B1 | 4/2001 | Galecki et al. |
| 6,331,763 | B1 * | 12/2001 | Thomas et al. ............... 320/136 |
| 6,368,932 | B1 | 4/2002 | Goebel et al. |
| 6,518,731 | B2 | 2/2003 | Thomas et al. |
| 6,628,498 | B2 | 9/2003 | Whitney et al. |
| 2002/0079865 | A1 | 6/2002 | Thomas et al. |
| 2002/0190324 | A1 | 12/2002 | Duane et al. |
| 2003/0020135 | A1 | 1/2003 | Kaminski et al. |
| 2003/0030120 | A1 | 2/2003 | Fujihira et al. |
| 2004/0099905 | A1 | 5/2004 | Baliga |

FOREIGN PATENT DOCUMENTS

| | | |
|---|---|---|
| JP | 59-143370 | 8/1984 |
| JP | 61-36979 | 2/1986 |

OTHER PUBLICATIONS

Fink, Electronic Engineer's Handbook, 2d Ed., p. 6-90; 1982.

European Search Report for European Application No. EP 05 10 5161, mailed Feb. 23, 2006.

* cited by examiner

CIRCUIT PROTECTION METHOD USING DIODE WITH IMPROVED ENERGY IMPULSE RATING

REFERENCE TO RELATED APPLICATION

This is a continuation of U.S. patent application Ser. No. 10/868,583 filed on Jun. 14, 2004, the disclosure thereof being incorporated herein in its entirety by reference thereto.

BACKGROUND OF THE INVENTION

1. Field of the Invention

The present invention relates to electrical circuit components. More particularly, the present invention relates to an overvoltage protection diode better capable of withstanding high energy electrical impulses.

2. Introduction to the Invention

Semiconductor diodes are usually defined as two-terminal, anode-cathode devices. Such diodes are most often constructed by adjacently forming in a wafer of semiconductor monocrystal p-type doped (positive electric charge carriers or "holes") and n-type doped (negative electric charge carriers or electrons) regions or layers to realize a p-n junction. For example, a p-type epitaxial layer may be formed on an n-type wafer or substrate to form a p-n junction, or an n-doped epitaxial layer may be formed on a p-doped wafer or substrate to form an n-p junction.

Semiconductor diodes typically manifest much higher electrical conductivity in one direction of current flow (forward bias) than in the other direction (reverse bias). However, in an operating condition typically referred to as "breakdown", for p-n diodes or p-n Zener diodes, when a certain reverse bias voltage level is reached (dependent upon diode fabrication details), reverse bias current flow occurs and rapidly transitions from a minute leakage current to a significant current flow.

Avalanche breakdown, which is the result of carrier "impact ionization", is a process that occurs in a semiconductor's space charge region or depletion region under a sufficiently high electric field which is the result of the voltage difference between the two sides of the diode. At that high field the net electron/hole generation rate due to impact ionization exceeds a critical value, enabling the current to rise indefinitely due to a positive feedback mechanism. Zener breakdown, a different phenomenon, is the result of band-to-band quantum tunneling of charge carriers across the potential barrier created by the applied reverse bias. This phenomena occurs in heavily doped semiconductor material and at relatively low reverse voltage levels. For silicon devices, this voltage is on the order of three to six volts. There is no abrupt transition between Zener tunneling and impact ionization. As higher reverse bias voltages are applied across a p-n junction, more impact ionization current is encountered.

The magnitude of the reverse bias current flow may vary from a minute leakage current to a substantial current beginning at the reverse breakdown level. At the reverse breakdown level the voltage level across the p-n junction remains substantially fixed, thereby rendering such diodes effective as a voltage reference or as a voltage limiter or voltage regulator, while operating under reverse bias conditions. However, unless the current flow is effectively limited to some maximum level, current-resistance (I×R) heating caused during avalanche breakdown can rapidly and permanently degrade or destroy the semiconductor diode structure.

The critical field at which idealized breakdown occurs is frequently presented as a function of semiconductor doping levels per cubic centimeter ("/cm$^3$") and generally varies from $10^{14}$ to $10^{18}$ (five decades). Thus, it is known to create graphs which indicate an idealized breakdown voltage for a given (e.g. negative carrier or n+) doping level. In practical semiconductor diode devices, structural edge effects create high field concentrations, and it is very unlikely that an idealized breakdown voltage can be realized in a realizable semiconductor device. Yet, for many years workers in the field have tried to come up with ways to increase the breakdown voltage in practical device structures in an attempt to approach the ideal breakdown voltage.

One example of a prior effort to increase reverse avalanche breakdown voltage at the surface of a planar silicon diode is set forth in U.S. Pat. No. 3,391,287 to Kao et al., for "Guard Junctions for P-N Semiconductor Devices". In this early patent one or more P-N junction "guard rings" were proposed to divide up the surface electric field into separated segments, so that surface breakdown was thereby forced to occur at a higher voltage level. Most of the problems that limit breakdown voltage are problems related to what happens at the surface of the silicon chip. So, as workers skilled in the art learned how to deal with these problems, they were able to develop devices capable of withstanding higher reverse breakdown voltages.

Conventional Zener diodes are essentially structures formed of planar layers that, under reverse bias electrical conditions below the avalanche breakdown voltage level, are analogous to oppositely facing plates of a capacitor. Depending upon how a particular semiconductor diode is fabricated, avalanche breakdown always takes place at a weakest point or area of the diode, i.e. at an area of highest electric field (measured as volts per micrometer). Since breakdown (and I×R heating) becomes concentrated at a weakest point or area of the diode junction, steps have been proposed in the prior art to limit or prevent breakdown at such weak points or areas.

While reverse avalanche breakdown is one problem confronting semiconductor diodes, it is not the only concern. When excessive power is dissipated in a semiconductor device, the resultant heating can damage, degrade, or destroy the device. Thus, another major problem is a semiconductor diode's survivability when it is confronted by a high energy condition, as predictably occurs in circuit protection devices and arrangements.

There have been a number of electrical and electronic devices that have been proposed in the prior art in efforts to solve electrical overstress and electrostatic discharge problems. Among these elements of the prior art are included ceramic capacitors, Zener diodes, transient voltage suppression ("TVS") diodes and thyristors, multilayer varistors, gas-plasma ionization devices, and Schottky diodes, for example. TVS diodes typically add a regular diode in series with a Zener diode in an effort to lower net capacitance across the diode structure. These TVS diode/thyristor structures can take a variety of forms, such as four or five layer (PNPN) monolithic silicon devices having a self-gating circuit set to be triggered at a predetermined voltage level. Initial response to an overvoltage condition is a clamping or avalanche effect, quickly followed by a crowbar action. The thyristor remains latched in its low impedance state until the current falls to a level less than a holding current, whereupon the thyristor returns to a high-resistance off state. One example of a PNPN constant-voltage diode providing over-voltage protection is disclosed in U.S. Pat. No. 5,430,311 to Murakami et al. Needless to say, these multi-layer structures can become very complicated and relatively expensive to manufacture.

A multi-element protection arrangement is proposed, for example, by U.S. Pat. No. 4,901,183 to Lee. Therein, a series of electrical/electronic elements including fast acting fuses, metal oxide varistors, capacitive-inductive networks and silicon TVS devices are arranged in a staged fashion to provide a series of defenses to protect a load against an overvoltage energy pulse. Several embodiments of integrated ESD/overcurrent devices are described in U.S. Pat. No. 6,628,498 to Whitney et al. One of the devices described therein appears to be a Zener diode chip mounted on top of a surface mount polymeric positive temperature coefficient (PPTC) resistor device. While that patent mentions Zener diodes, it also proposes varistors or thyristors having characteristics useful for protecting against overvoltage conditions for different applications. Commonly assigned U.S. Pat. No. 6,518,731 to Thomas et al. includes embodiments wherein a Zener diode is mounted to, or in thermal contact with, a PPTC resistor device to provide thermal coupling between the two electrically interconnected circuit protection elements.

A hitherto unsolved need has remained for a simplified semiconductor diode structure that can withstand a higher energy pulse condition than can be withstood by conventional Zener diodes and reverse avalanche (impact ionization) diodes.

BRIEF SUMMARY OF THE INVENTION

A general object of the present invention is to provide a circuit protection method employing a PPTC resistor device and a thermally-coupled overvoltage protection diode that is more capable of withstanding high energy electrical impulses than diodes of the prior art.

Another object of the present invention is to provide an energy pulse absorbing overvoltage protection diode that is structurally more simple and less expensive to make than existing transient voltage suppression (TVS) diodes and thyristors having complex multiple junctions and layers.

Another object of the present invention is to provide an improved energy pulse absorbing overvoltage protection diode for use in a protection circuit including a PPTC resistive element such that heat generated in the diode is directly transferred to the PPTC resistive element, aiding it to trip to a high resistance state and thereby aid in protecting a load from the energy pulse.

Another object of the present invention is to provide an improved energy pulse absorbing overvoltage protection diode of at least a pair of regions of differing characteristics in a silicon chip in effective electrical and thermal proximity to each other such that a first region begins to absorb energy of an electrical pulse before a second region begins to absorb the energy of the pulse. This preferred arrangement enables the chip to present a staged response to the energy pulse and results in distribution of heat generated in response to the energy pulse more evenly across the chip, leading to a higher degree of protection diode survivability.

A semiconductor device in accordance with principles and aspects of the present invention consists essentially of a planar substrate of semiconductor material having carriers of a first type of conductivity in a first, high concentration level (e.g. n++), a first major face and a second major face opposite to the first major face; an epitaxial layer, or a continuation of the planar substrate, of semiconductor material formed on the first major face, having carriers of the first type of conductivity in a second concentration level lower than the first level (e.g. n+), and having an outer surface; at least one region formed at the outer surface and extending to a first predetermined depth and having carriers of a second type of conductivity in a third concentration level (e.g. p+); at least one cell formed at the outer surface and extending to a second predetermined depth, and having carriers of the second type of conductivity in a fourth concentration level greater than the third concentration level (e.g. p++); a first electrode layer (e.g. cathode electrode) formed at the outer surface of the epitaxial layer; and, a second electrode layer (e.g. anode electrode) formed at the second major face of the semiconductor substrate.

The semiconductor device may include a plurality of highly doped cells separated from each other by a single less highly doped region or by multiple less highly doped regions. The depth of the highly doped cells may be greater than, equal to, or less than the depth of the less highly doped region or regions. The exemplary semiconductor device is most preferably included for use and operation within an overvoltage protection circuit including, for example, a polymeric positive temperature coefficient (PPTC) resistive element electrically connected in series with the cathode electrode and thermally coupled to the semiconductor device by direct contact therewith.

These and other objects, advantages, aspects and features of the present invention will be more fully understood and appreciated upon consideration of the detailed description of preferred embodiments presented in conjunction with the following drawings.

DETAILED DESCRIPTION OF THE INVENTION

We have discovered a diode chip layout and construction that improves the diode's temperature withstanding capabilities in response to an overvoltage energy pulse. This diode includes higher resistivity regions (e.g. p+ regions) created through epitaxial growth or impurity diffusions. Heavier doping is provided in cell regions (e.g. p++) of the diode to insure Zener tunneling and/or impact ionization at a reverse bias voltage breakdown level. As the chip temperature increases, the less heavily doped (p+) regions reach intrinsic (ohmic) transition temperature before the more heavily doped (p++) cell regions, thus focusing anode-cathode current through these less heavily doped areas of the chip die. This transfer of current flow increases the temperature in the less heavily doped regions, thereby spreading the temperature more evenly across the chip die and affecting the ohmic current-voltage behavior of the less heavily doped regions. The ratio of intrinsic/Zener voltage levels will vary in accordance with doping concentrations, die layout of the regions and cells and temperature dissipation capabilities (heat sinking) of the diode die.

Figure 1:
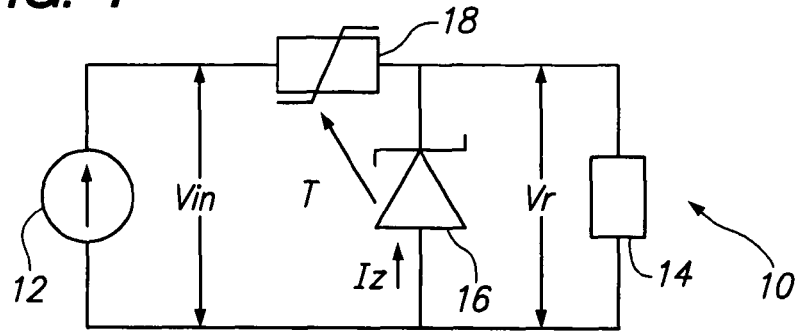
FIG. 1 is a schematic circuit diagram of a shunt-configured overvoltage protection circuit in which a PPTC element is thermally, as well as electrically, coupled to a reverse avalanche or Zener breakdown protection diode element in accordance with principles of the present invention.

FIG. 1 illustrates an exemplary shunt regulator circuit 10. Herein, the circuit 10 is connected electrically between an energy source 12 and a load 14; and, the circuit 10 includes a shunt regulator-protector diode element 16, such as a reverse biased avalanche breakdown diode or Zener diode in accordance with principles of the present invention. The circuit 10 also includes a series resistive element 18, most preferably a PPTC resistive element. The element 16 is most preferably thermally connected to the PPTC resistive element 18, for example, by having the die of element 16 sized and arranged to be in direct physical contact with the PPTC resistive element, as taught for example in commonly assigned U.S. Pat. No. 6,518,731, referred to above, the disclosure thereof being incorporated herein by reference.

When a unipolar overvoltage condition occurs as in an energy pulse or spike, a considerable current begins to flow through the diode 16. As used herein, the term "overvoltage" means that the voltage level of the energy pulse is above a reverse avalanche breakdown rating, or Zener tunneling rating, of the diode 16. This current flow results in a rapid heat build up within the diode 16. Because of the thermal coupling, the diode's heat is transferred to the PPTC element 18. After a short heating interval brought on by the energy pulse the PPTC element 18 will reach a "trip" temperature and thereupon rapidly increase in electrical resistance. When the PPTC element 18 enters its trip state the current flow through the regulator diode 16 and the load 14 is substantially reduced. In accordance with principles of the present invention, thermal heating in response to the energy pulse is spread more uniformly throughout the structure of the diode 16 and allows it to absorb more energy and withstand greater heat over a longer initial heating interval without resultant irreversible damage or failure, than occurs in Zener diode devices of the prior art.

Figure 2:
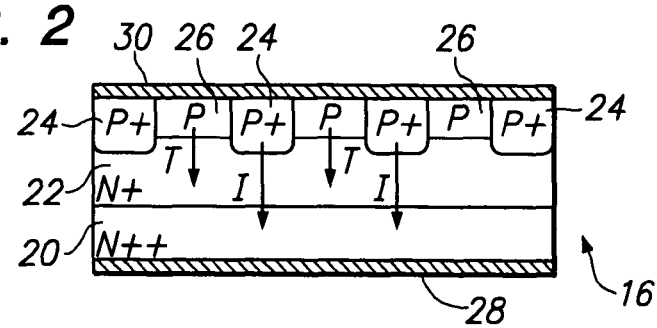
FIG. 2 is an enlarged view in elevation and section of an improved energy-pulse-withstanding diode in accordance with principles of the present invention.

FIG. 2 illustrates an exemplary structure forming the Zener diode 16 in accordance with principles of the present invention. The multi-layer diode 16 includes a semiconductor substrate 20 such as a highly doped n-carrier silicon wafer or chip. An epitaxial layer 22 of less heavily doped n-carrier silicon is formed on the substrate 20. At least one, and preferably a series of heavily doped p-carrier cells 24 are formed in the epitaxial layer 22 and extend into physical and electrical proximity of the highly doped n-carrier silicon substrate 20. Lightly doped p-carrier regions 26 extend between the heavily doped cells 24. While multiple cells 24 and regions 26 are shown in an interleaved arrangement in FIGS. 2, 5, and 6, a single cell 24 having a suitably sinuous, or other continuous, form and being distributed across a chip otherwise forming the region 26 is also within the scope of the present invention.

Figure 11:
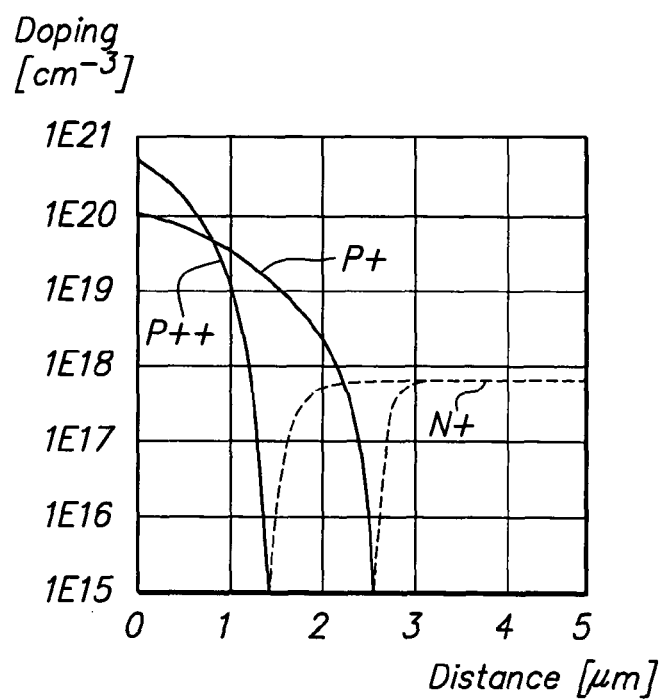
FIGS. 11 and 12 present two examples of doping profile per cubic centimeter that are applicable to a diode made in accordance with the FIGS. 10A-10E process sequence.
Figure 12:
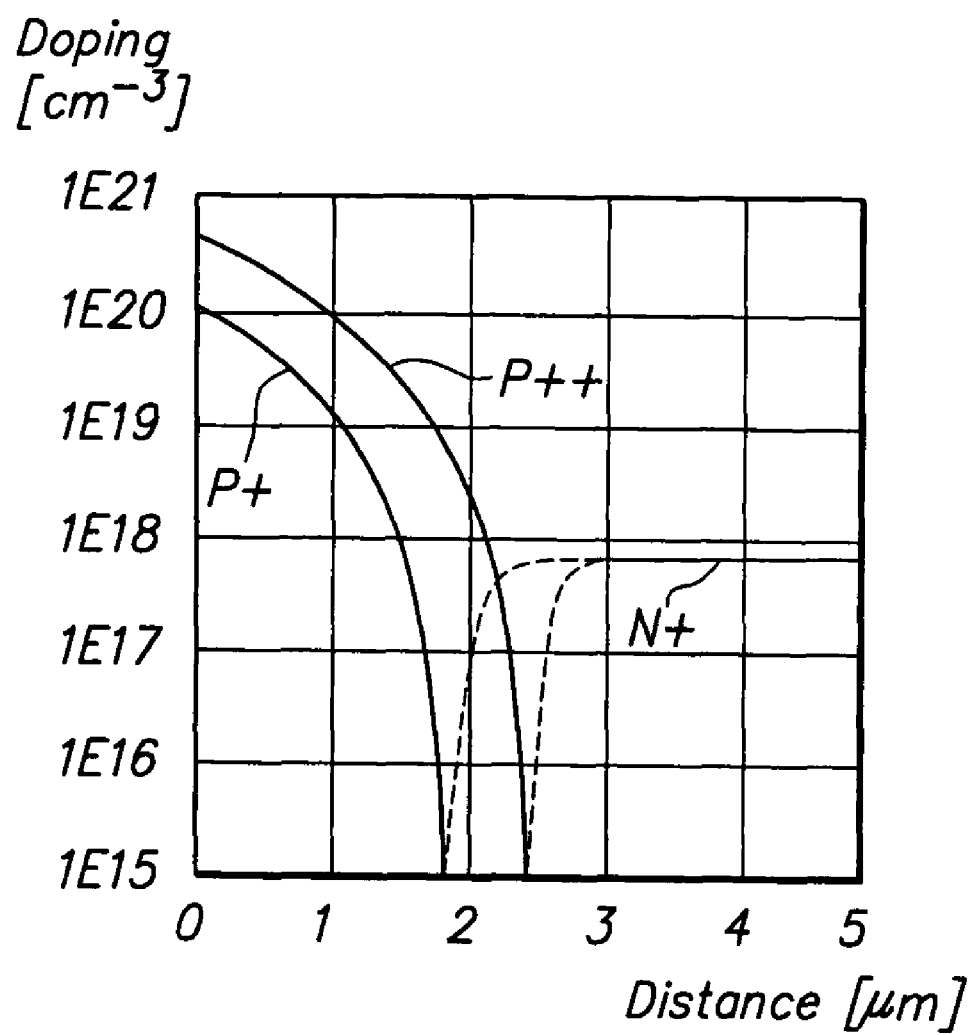

The relative junction's doping depths into the epitaxial layer 22 which form regions 24 and cells 26 may vary, depending upon desired diode characteristics. As shown in FIGS. 2 and 12, the depth of heavily doped cells 24 is greater than the depth of interleaved less heavily doped regions 26, but the reverse arrangement is also within contemplation of the present invention as shown by the graph of doping concentrations in FIG. 11, for example. A bottom metal electrode layer (anode) 28 is preferably formed to be coextensive with a lower major surface of the silicon substrate 20; and a top metal conductor layer (cathode) 30 is preferably formed to be coextensive with and electrically connected to an outer surface of the cells 24 and the regions 26.

In the FIG. 2 example, the chip substrate 20 is heavily doped negative carrier, n-type material on the order of at least $10^{20}$ n-type dopant ions/cm$^3$ (N++). The epitaxial layer 22 is less heavily doped negative carrier N-type material on the order of about $10^{17}$ dopant ions/cm$^3$ (N+). The heavily positive carrier p-doped cells 24 are in a range of $10^{21}$ to $10^{15}$/cm$^3$; and, the more lightly doped positive carrier p-doped regions 26 on the order of $10^{20}$ to $10^{15}$/cm$^3$, as a function of distance as shown in FIGS. 11 and 12, for example.

In response to an overvoltage energy pulse, the heavily doped cells 24 ensure initial Zener tunneling (or reverse avalanche breakdown as the case may be) through each path from the p++ cell 24 to an adjacently underlying n++ region of the substrate as shown by arrows labeled "I" in FIG. 2 shown extending from the cells 24.

During the energy pulse interval, and as temperature builds within the diode chip 16, the more lightly doped regions 26 may reach a transition temperature at which silicon atoms forming the substrate and the epitaxial layer begin emitting electrons, increasing the leakage current and possibly reaching a level at which there is no energy or potential barrier between the p-region 26 and the n+ region 22 (herein referred to as an "intrinsic" or "ohmic" condition manifested by bi-directional low resistance, high current flow). When the diode formed at the region 26 reaches an intrinsic, ohmic state (which occurs at a lower substrate temperature than at the heavily doped p++ cells 24), current flow through the Zener structure (and local heating) thereupon becomes distributed more evenly throughout the chip substrate. When the lightly doped p+ regions 26 reach intrinsic (ohmic) high temperature, current flow becomes concentrated through these bi-directional ohmic regions as shown by the T arrow bisecting the regions 26 in FIG. 2.

The current flow through the ohmic regions may increase the temperature, thus affecting the ohmic-like I-V behavior. In practice the ratio of intrinsic/Zener voltages of the diode 18 in response to an energy pulse will vary with doping, die layout and temperature/heatsinking of the diode device. By assuring improved reverse bias dynamic and steady state current distribution at low as well as high chip temperatures, a diode manufactured according to the principles of the present invention results in improved high temperature withstanding capability and ultimately is more survivable than conventional Zener diodes when confronted by an over-voltage high energy pulse.

Figure 3:
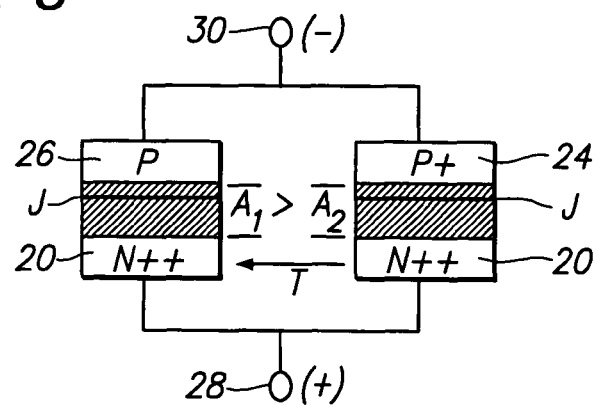
FIG. 3 is an enlarged diagrammatic sectional view and schematic circuit of two representative diode sections of the FIG. 2 diode structure.
Figure 4:
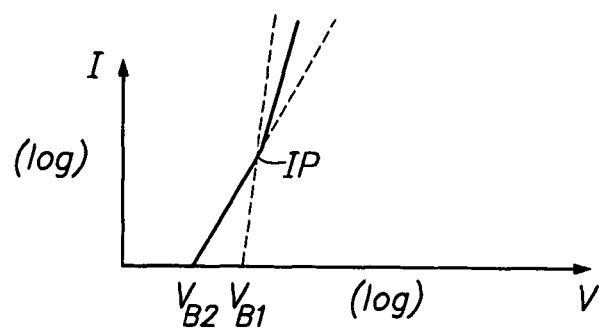
FIG. 4 is a graph (ordinate axis log scale) illustrating reverse breakdown IV characteristics of the FIG. 3 model.

As an aid to further understanding, FIG. 3 symbolically divides the diode 16 into two diodes, one including the lightly doped region 26 (left diode) and the other including the heavily doped cell 24 (right diode). If these two diodes are reverse biased by applying a positive potential to electrode 28 and a negative return path at electrode 30, two depletion regions will be formed: a wider region A1 in the less heavily doped left diode and a narrower region A2 in the more heavily doped right diode. As the reverse bias voltage is increased a level is reached ($V_{B2}$ in FIG. 4) a first critical field is reached at which avalanche current or tunneling current will begin to flow in the right diode, but not in the left diode. The critical field will happen somewhere in the idealized right diode in the vicinity of its metallurgical junction (J). As the voltage increases, a second critical field is reached (voltage level $V_{B1}$ in FIG. 4) at which avalanche current or tunneling current will begin to flow in the left diode as well. A composite current flow through both diodes then results, beginning at an intercept point (IP) in the FIG. 4 graph.

When the two diodes of FIG. 3 are formed as adjacent separate regions in the same structure, as in diode 16 of the present invention, thermal heating at the cells 24 is rapidly transferred to the adjacent regions 26, and this heating tends to lower the critical field voltage characteristic of the left diode as well as increase leakage current through the left diode. When the second critical voltage level $V_{B1}$ is reached and both diode parts are conducting, internal heating is spread more uniformly throughout the chip 16 than heretofore, thereby increasing the ability of the diode 16 to withstand a high energy pulse.

Because the FIG. 3 left diode is more lightly doped than the right diode, the left diode will reach a transition temperature (e.g. approximately 350° C.) at which the left diode transitions to intrinsic or ohmic characteristics. This transition temperature is lower than a transition temperature of the more heavily doped right diode (e.g. 600° C. to 700° C.). As a practical matter, unless energy dissipated by the diode 16 is limited to a maximum level, ultimately the diode 16 will melt down and become destroyed. What we have discovered is that with our new diode structure as explained herein, the exemplary diode 16 is better able to withstand a high energy pulse than diodes of the prior art of which we are aware. In one preferred application the diode 16 is better able to withstand a high energy pulse during a time interval sufficient to enable a coupled PPTC device to trip and place a very high electrical resistance in series between the current source 12 and the diode 16 (and load 14). As explained in connection with the FIG. 1 example, survivability of the diode 16 is further enhanced when the diode 16 is effectively thermally coupled to the PPTC resistor device 18.

Figure 5:
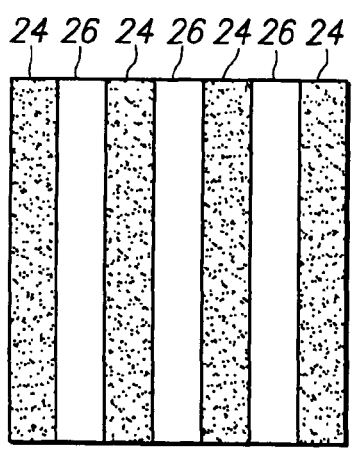
FIG. 5 is an enlarged diagrammatic top plan view of one preferred example of a semiconductor diode structure in accordance with the FIG. 2 principles.
Figure 6:
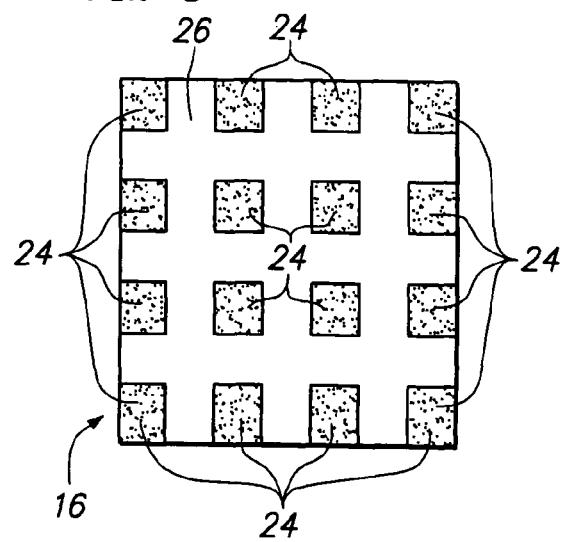
FIG. 6 is an enlarged diagrammatic top plan view of a second preferred example of a semiconductor diode structure in accordance with the FIG. 2 principles.

FIG. 5 shows an arrangement of the diode 16 wherein the highly doped cells 24 are defined in rows separated by rows of the lightly doped regions 26. In this example there are three discrete regions 26 separating four cells 24. FIG. 6 shows an alternative arrangement of the diode 16 wherein there are, e.g., 16 highly doped generally square cells 24 separated by a continuous single lightly doped region 26. While square box cells 24 are illustrated by way of example, the cells could equally well be rounded or round cylinders, for example. Consequently, the cells and regions need not be geometric rectangular or square boxes, and they can follow a wide variety of other solid geometric shapes, whether straight-edged or having curved edges and/or being sinuous.

Figure 7:
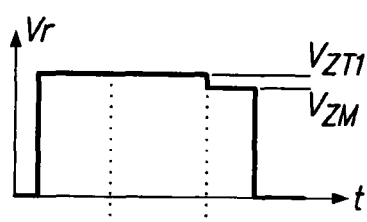
FIG. 7 is a graph of output voltage versus time of a reverse bias over-voltage pulse applied to the FIG. 1 protection circuit.
Figure 8:
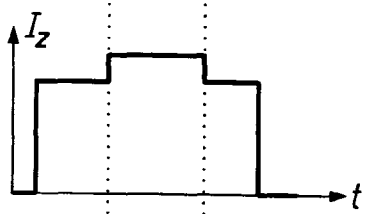
FIG. 8 is a graph of current versus time of the reverse bias over-voltage pulse of FIG. 7.
Figure 9:
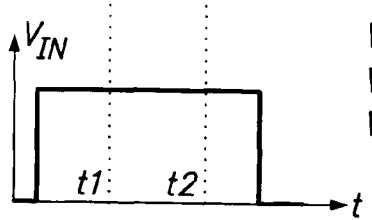
FIG. 9 is a graph of input voltage versus time of the FIG. 7 reverse bias over-voltage pulse.

FIG. 7 illustrates a reverse bias overvoltage pulse Vr appearing across the shunt diode 16 and load 14 in the FIG. 1 circuit. The levels Vzt1 and Vzm represent voltage levels across the anode and cathode electrodes of diode 16 at progressive time intervals during the pulse duration. FIG. 8 graphs the current flowing through the diode 16, and FIG. 9 graphs the input voltage supplied by energy pulse source 12.

If the source of the Vr pulse (pulse generator 12) has a sufficiently low source impedance, after the passage of a time duration t1 the diode temperature may increase to a level consistent with intrinsic doping conditions. At such elevated temperature the reverse blocking capabilities of the PN junction at region(s) 26 are significantly reduced or cease to exist, and the cathode-anode path will exhibit ohmic behavior. The electrical resistance of the PPTC element 18 will increase due to its intrinsic power dissipation and assisted heating from the die of diode 16. As the resistance of PPTC element 18 increases, the diode power dissipation decreases. At a time t2 later than time t1 the p-n junction regains most of its voltage blocking capabilities with the result that current flowing through the diode 16 decreases.

Figure 7A:
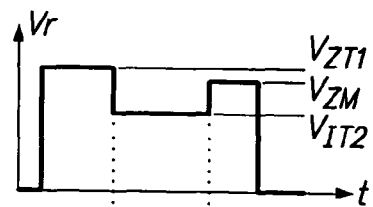
FIG. 7A is a graph of output voltage when a current-limited source applies the over-voltage pulse.
Figure 8A:
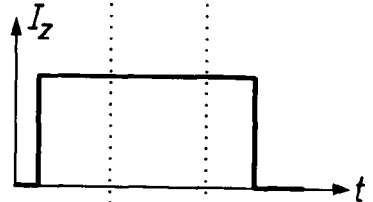
FIG. 8A is a graph of current versus time of the reverse bias over-voltage pulse depicted in FIG. 7A.
Figure 9A:
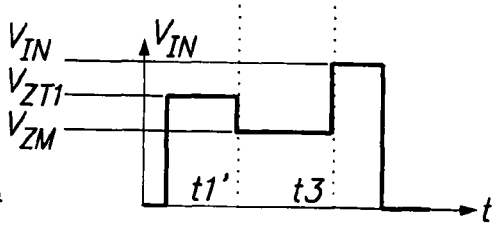
FIG. 9A is a graph of input voltage versus time of the reverse bias over-voltage pulse depicted in FIG. 7A.

The shape and the amplitude ratios of the current Iz and voltage Vr waveforms may change, for example depending upon the pulse source characteristics, the doping levels of the diode 16, chip layout and the thermal characteristics of the diode/PPTC circuit arrangement. FIGS. 7A, 8A, and 9A respectively depict Vr, Iz and Vin waveforms when using a current-limited energy pulse source. In this example, the output voltage Vr (FIG. 7A) will fold back partially and recover after the PPTC element 18 "trips" to its very high resistance state at time t3, for example. While the current through the diode 16 remains constant (FIG. 8A), the input voltage will vary (FIG. 9A) between times t1 and t3.

Figure 10A:
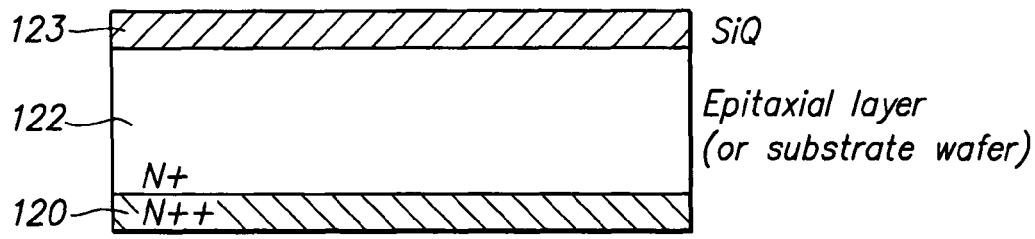
FIGS. 10A, 10B, 10C, 10D and 10E present a sequence of processing steps for constructing a diode incorporating the FIG. 2 principles of the present invention.

FIGS. 10A through 10E progressively illustrate at a simplified level a process sequence for making a high energy clamp diode, such as diode 16. FIG. 10A shows a first series of process steps. An n-type, heavily doped silicon wafer 120 is subjected to epitaxial layer growth. An epitaxial n+ layer 122 is grown on the top surface of the n++ wafer 120. The n+ layer 122 has a doping concentration lower than the n++ wafer 120. While layer 122 is shown as a heavily doped n++, a heavily doped p++ wafer having a less heavily doped p+ epitaxial layer can be used as well. A layer 123 of silicon dioxide is grown on the top surface of the epitaxial layer 122. The thickness of epitaxial layer 122 can vary over a range; in the present example the epitaxial layer thickness is approximately 5 microns. The silicon dioxide layer 123 is approximately 1 micron thick.

It should be noted that the starting wafer or substrate is preferably chosen to have the lowest possible resistivity (highest doping level), so that the wafer (chip) contribution to the diode's total parasitic series resistance is minimized. Therefore, the epitaxial layer should exhibit a lower doping level of the same type carrier, or have an opposite polarity carrier doping. If a higher series resistance is acceptable in a particular circuit protection application, doping levels can be traded off by using a substrate with a lower doping level and eliminating the top side epitaxial layer. This alternative approach would be expected to lower the manufacturing cost of the resultant protection diode.

Figure 10B:
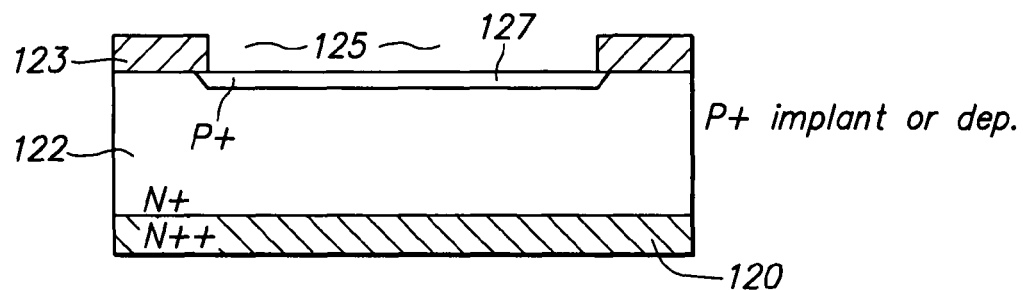

FIG. 10B shows a second series of process steps. An opening 125 is defined in the silicon dioxide layer 123, by use of conventional masking and etch techniques. This opening will have an area equal to an active area of each finished diode formed by and yielded from the processed wafer 120. In practice, the opening is in a range of 1 mm by 1 mm, but can be larger or smaller. A p-carrier ion implantation and a short diffusion are carried out, forming a layer 127. Any conventional doping technique can be used to create the p+ carrier layer 127 in the n+ epitaxial layer 122.

Figure 10C:
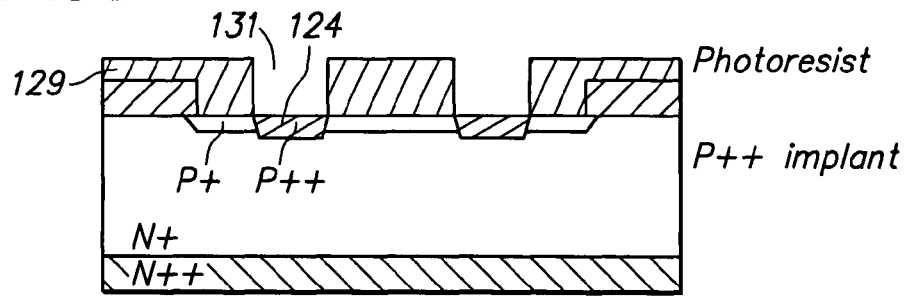

FIG. 10C shows a third series of process steps. A photoresist mask 129 is formed and patterned to define an array of openings 131 in the diode area 125 defined by the FIG. 10B step. A p+ carrier ion implantation is carried out through the openings defined by the patterned photoresist mask 129. The implantation dosage is selected to create a doping level in newly doped regions 124 in excess of the doping level of region 127.

Figure 10D:
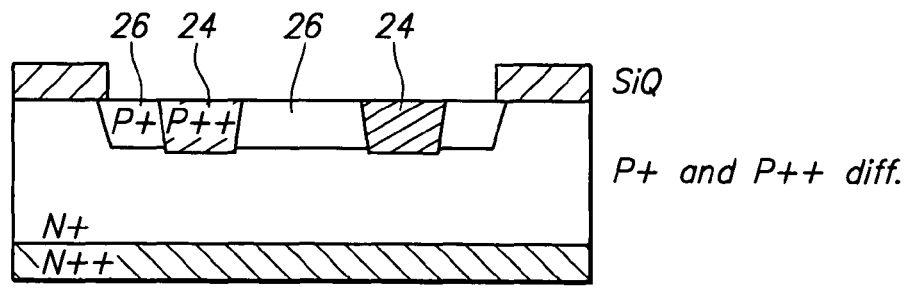

FIG. 10D shows a fourth series of process steps. The photoresist layer 129 is removed using conventional techniques and a diffusion step is carried out. The diffusion step forms the heavily doped cell regions 24 and the less heavily doped regions 26 of the diode 16. In this example the p++ openings are typically approximately 15 microns wide, but other widths and lengths can be used, depending upon a particular diode design. Final junction depth of the cells 24 is approximately 2 microns.

Figure 10E:
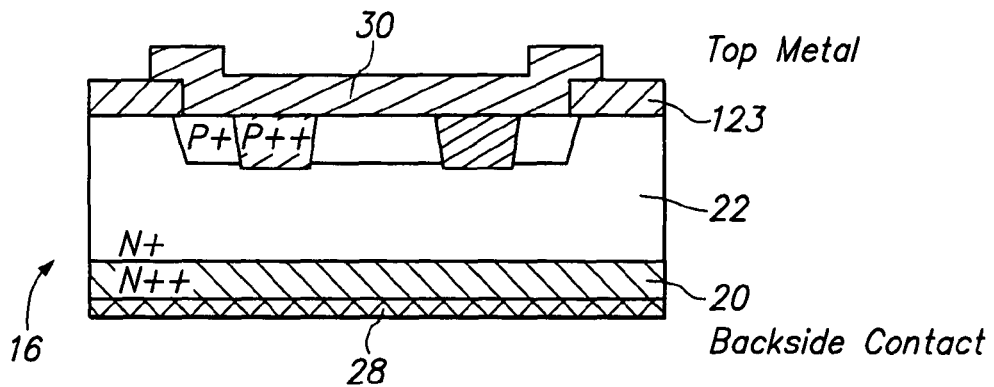

FIG. 10E shows a final series of process steps. Top contact metallization is applied forming the cathode electrode 30, and bottom contact metallization is applied forming the anode electrode 28. The wafer is then "diced" in order to yield individual dies of diodes 16. The dies may be packaged as individual electrical components, or they may be combined directly with resistive elements, such as PPTC resistive element 18, as explained above.

FIGS. 11 and 12 show two types of doping impurity distributions per cubic centimeter that may be used in making the exemplary diode 16. FIG. 11 shows that the p++ concentration of cells 24 extends into the layer 22 for a distance less than the p+ layer of regions 26. FIG. 12 shows the p++ concentration of cell 24 extends into the layer 22 for a distance greater than the p+ region 26, as shown diagrammatically in FIG. 2. The doping values are shown as reference examples, and higher or lower values can be used, depending upon the intended application or available processing capabilities and conditions.

The structural layout alternatives illustrated herein in FIGS. 5 and 6 and the underlying concept of distributing at least two different reverse voltage breakdown zones over the surface of the diode chip may be used not only for energy clamp diodes, such as diode 16, but for other forms of diodes that need to operate at high temperature under reverse bias voltage and high current densities.

Having thus described preferred embodiments of the invention, it will now be appreciated that the objects of the invention have been fully achieved, and it will be understood by those skilled in the art that many changes in construction and widely differing embodiments and applications of the invention will suggest themselves without departing from the spirit and scope of the invention. Therefore, the disclosures and descriptions herein are purely illustrative and are not intended to be in any sense limiting.

What is claimed is:

1. A method for protecting an electrical circuit load from a high energy pulse including steps
    connecting a polymeric positive temperature coefficient (PPTC) resistive element in series with the electrical circuit load and an energy source;
    connecting a reverse breakdown overvoltage energy pulse absorbing semiconductor device as a shunt element between the electrical circuit load and the PPTC resistive element, said semiconductor device having a heat transfer surface sized in relation to, and in direct thermal contact with, the PPTC resistive element;
    forming the semiconductor device by steps including:
        (a) forming a planar substrate of semiconductor material having carriers of a first type of conductivity in a first predetermined concentration level, a first major face and a second major face opposite to said first major face, the carriers comprising a negative carrier, n-type doping material to have a doping concentration of approximately at least $10^{20}$ n-type dopant ions/cm$^3$;
        (b) forming an epitaxial layer on said substrate with a negative carrier, n-type doping material having a doping concentration of approximately $5 \times 10^{17}$ dopant ions/cm$^3$;
        (c) forming at least one region at said first major face and having carriers of a second type of conductivity in a second predetermined concentration level, the at least one region having a positive carrier, p-type doping material having a doping concentration in a range between $10^{20}$ and $10^{15}$ dopant ions/cm$^3$;
        (a) forming at least one cell at said first major face and having carriers of said second type of conductivity in a third concentration level greater than said second concentration level, the at least one cell having a positive carrier, p-type doping material having a doping concentration in a range between $5 \times 10^{21}$ and $10^{15}$ dopant ions/cm$^3$;
        (b) forming a first electrode layer at said first major face;
        (f) forming a second electrode layer formed at said second major face; and,
        (g) forming one of said first electrode layer and said second electrode layer comprising the heat transfer surface of the semiconductor device;
    receiving the high energy electrical pulse from the energy source into the semiconductor device thereby causing the at least one cell to become a first-level unidirectional conduction region for generating heat and transferring heat to the at least one region and thereupon causing the at least one region to become a second-level bi-directional intrinsic conduction and heat generating region; and
    transferring the heat from the first-level unidirectional conduction region and from the intrinsic conduction and heat generating region to the PPTC resistive element via the heat transfer surface, thereby accelerating trip of the PPTC resistive element to a high resistance state and disconnecting the electrical circuit load and the semiconductor device from the energy source.

2. The method set forth in claim 1 wherein the step of forming the semiconductor device includes forming a plurality of cells separated from each other by said at least one region.

3. The method set forth in claim 1 wherein the step of forming the semiconductor device includes forming a plurality of cells separated by each other by said at least one region.

4. The method set forth in claim 1 including the step of forming said at least one region to have a third dopant concentration level causing the at least one region to become the second bi-directional intrinsic conduction and heat generating region as temperature of the semiconductor device approaches an intrinsic temperature of approximately 350° C. in response to the high energy pulse.

5. A method for protecting an electrical circuit load from a high energy pulse including steps of:
    connecting a polymeric positive temperature coefficient (PPTC) resistive element in series with the electrical circuit load and an energy source;
    connecting a reverse breakdown overvoltage energy pulse absorbing semiconductor device as a shunt element between the electrical circuit load and the PPTC resistive element, said semiconductor device having a heat transfer surface sized in relation to, and in direct thermal contact with, the PPTC resistive element;
    forming the semiconductor device by:
        a. forming a planar substrate of semiconductor material having carriers of a first type of conductivity in a first, high concentration level, a first major face and a second major face opposite to said first major face, said planar substrate of said reverse breakdown semiconductor device being sized in relation to said switching element, the carriers comprising a negative carrier, n-type doping material to have a doping concentration of approximately at least $10^{20}$ n-type dopant ions/cm$^3$;

b. forming an epitaxial layer on said planar substrate with a negative carrier, n-type doping material having a doping concentration of approximately $5 \times 10^{17}$ dopant ions/cm$^3$;

c. forming a layer of semiconductor material being one of in or on said substrate adjacent said first major face, having carriers of said first type of conductivity in a second concentration level lower than said first level, and having an outer surface;

d. forming at least one region at said outer surface extending to a first predetermined depth into said layer and having carriers of a second type of conductivity in a third concentration level to become a second-level bi-directional intrinsic conduction region as an intrinsic temperature of said at least one region is approached in response to thermal energy initially generated elsewhere in said device in response to a high energy electrical pulse, the carriers in the at least one region comprising a positive carrier, p-type doping material having a doping concentration in a range between $10^{20}$ and $10^{15}$ dopant ions/cm$^3$;

e. forming at least one cell at said outer surface and extending to a second predetermined depth in said substrate greater than the first predetermined depth of said at least one region and having carriers of said second type of conductivity in a fourth concentration level greater than said third concentration level to become a. first-level reverse conduction region for initially generating and transferring heat to the at least one region in response to the high energy electrical pulse, the at least one cell comprising a positive carrier, p-type doping material having a doping concentration in a range between $5 \times 10^{21}$ and $10^{15}$ dopant ions/cm$^3$;

f. forming a first electrode layer formed at and coextensive with said outer surface;

g. forming a second electrode layer formed at and coextensive with said second major face; and h. configuring one of the first electrode layer and the second electrode layer to be in thermal contact with the switching element for transferring heat generated by said semiconductor device in response to the high energy electrical pulse to said PPTC resistive element.

6. The method set forth in claim 5 wherein the step of forming the semiconductor device includes forming a plurality of cells separated from each other by said at least one region.

7. The method set forth in claim 5 wherein the step of forming the semiconductor device includes forming a plurality of cells separated by each other by said at least one region.

8. The method set forth in claim 5 including the step of forming said at least one region to have a third dopant concentration level causing the at least one region to become the second bi-directional intrinsic conduction and heat generating region as temperature of the semiconductor device approaches an intrinsic temperature of approximately 350° C. in response to the high energy pulse.

\* \* \* \* \*